(12) United States Patent
Yamamoto et al.

(10) Patent No.: US 11,270,881 B2
(45) Date of Patent: Mar. 8, 2022

(54) PLASMA DEPOSITION METHOD, PLASMA DEPOSITION APPARATUS AND METHOD OF MANUFACTURING SEMICONDUCTOR DEVICE

(71) Applicant: Samsung Electronics Co., Ltd., Suwon-si (KR)

(72) Inventors: Kaoru Yamamoto, Seongnam-si (KR); Chang-Hyun Kim, Seoul (KR); Hyun-Jae Song, Hwaseong-si (KR); Keun-Wook Shin, Yongin-si (KR); Hyeon-Jin Shin, Suwon-si (KR); Sung-Joo An, Yongin-si (KR); Chang-Seok Lee, Seoul (KR); Kee-Young Jun, Seongnam-si (KR); Geun-O Jeong, Incheon (KR); Jang-Hee Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 16/385,441

(22) Filed: Apr. 16, 2019

(65) Prior Publication Data

US 2020/0075324 A1    Mar. 5, 2020

(30) Foreign Application Priority Data

Sep. 5, 2018    (KR) ......................... 10-2018-0105731

(51) Int. Cl.
*H01J 37/32* (2006.01)
*H01L 21/02* (2006.01)
*H01L 21/67* (2006.01)

(52) U.S. Cl.
CPC .. *H01L 21/02252* (2013.01); *H01J 37/32192* (2013.01); *H01L 21/67207* (2013.01)

(58) Field of Classification Search
CPC ..................... H01L 21/02252; H01J 37/32192
See application file for complete search history.

(56) References Cited

U.S. PATENT DOCUMENTS

| | | | |
|---|---|---|---|
| 6,172,322 B1 | 1/2001 | Shang et al. | |
| 6,645,303 B2 | 11/2003 | Frankel et al. | |
| 7,608,549 B2 | 10/2009 | Van Nooten et al. | |
| 7,722,737 B2 | 5/2010 | Gondhalekar et al. | |
| 8,349,085 B2 | 1/2013 | Tahara et al. | |
| 8,726,838 B2 | 5/2014 | Shanker et al. | |
| 9,245,744 B2 | 1/2016 | Shanker et al. | |
| 9,783,889 B2 | 10/2017 | Tzu et al. | |
| 2002/0020498 A1* | 2/2002 | Ohmi ...................... | H01L 22/10 156/345.12 |

(Continued)

FOREIGN PATENT DOCUMENTS

KR    2002-0032408 A    5/2002

*Primary Examiner* — Mohammad M Choudhry
(74) *Attorney, Agent, or Firm* — Muir Patent Law, PLLC (57) ABSTRACT

In a plasma deposition method, a substrate is loaded onto a substrate stage within a chamber. A first plasma is generated at a region separated from the substrate by a first distance. A first process gas is supplied to the first plasma region to perform a pre-treatment process on the substrate. A second plasma is generated at a region separated from the substrate by a second distance different from the first distance. A second process gas is supplied to the second plasma region to perform a deposition process on the substrate.

15 Claims, 11 Drawing Sheets

(56) References Cited

U.S. PATENT DOCUMENTS

2015/0064825 A1* 3/2015 Huh ................... C23C 14/541
                                                    438/34
2016/0013064 A1* 1/2016 Kim ................ H01J 37/32165
                                                    438/714
2018/0096874 A1   4/2018 Schaller et al.

* cited by examiner

PLASMA DEPOSITION METHOD, PLASMA DEPOSITION APPARATUS AND METHOD OF MANUFACTURING SEMICONDUCTOR DEVICE

PRIORITY STATEMENT

This application claims priority under 35 U.S.C. § 119 to Korean Patent Application No. 10-2018-0105731, filed on Sep. 5, 2018 in the Korean Intellectual Property Office (KIPO), the contents of which are herein incorporated by reference in their entirety.

BACKGROUND

1. Field

Example embodiments relate to a plasma deposition method, a plasma deposition apparatus and a method of manufacturing a semiconductor device. More particularly, example embodiments relate to a deposition method using microwave plasma, a plasma deposition apparatus for performing the same and a method of manufacturing a semiconductor device using the plasma deposition apparatus.

2. Description of the Related Art

In a microwave deposition apparatus, a plasma density directly below an insulation plate in an upper portion of a chamber may be extremely high, and the plasma density may decrease gradually toward a substrate. In a deposition process, in order to decrease damages on a wafer, it may be beneficial that a distance between the wafer and the insulation plate is relatively large. In a pre-treatment process, in order to increase lifetime of hydrogen radicals, it may be beneficial that the distance between the wafer and the insulation plate is relatively small. However, conventional deposition apparatuses do not provide flexible process conditions satisfying the deposition process and the pre-treatment process.

SUMMARY

Example embodiments provide a plasma deposition method capable of decreasing damages on a wafer and improving plasma uniformity, process controllability and productivity.

Example embodiments provide a plasma deposition apparatus for performing the plasma deposition method.

According to some example embodiments, in a plasma deposition method, a substrate is loaded onto a substrate stage within a chamber. A first plasma is generated at a region separated from the substrate by a first distance. A first process gas is supplied to the first plasma region to perform a pre-treatment process on the substrate. A second plasma is generated at a region separated from the substrate by a second distance different from the first distance. A second process gas is supplied to the second plasma region to perform a deposition process on the substrate.

According to some example embodiments, in a plasma deposition method, a substrate is loaded onto a substrate stage within a chamber. A first gap is maintained between the substrate stage and an insulation plate. A first plasma is generated between the substrate stage and the insulation plate. A first process gas is supplied to a first region in which the first plasma is generated to perform a pre-treatment process on the substrate. A second gap is maintained between the substrate stage and the insulation plate, the second gap being greater than the first gap. A second plasma is generated between the substrate stage and the insulation plate. A second process gas is supplied to a second region in which the second plasma is generated to perform a deposition process on the substrate.

According to an example embodiment, a plasma deposition method includes steps of loading a substrate onto a first substrate stage of a first assembly comprising a plurality of substrate stages, maintaining a first gap between the first substrate stage and a first insulation plate of a second assembly comprising a plurality of insulation plates, generating a first plasma between the first substrate stage and the first insulation plate, supplying a first process gas to a first region in which the first plasma is generated to perform a pre-treatment process on the substrate, maintaining a second gap between the first substrate stage and a second insulation plate of the second assembly, the second gap being greater than the first gap, generating a second plasma between the first substrate stage and the second insulation plate, and supplying a second process gas to a second region in which the second plasma is generated to perform a deposition process on the substrate, wherein the first assembly installed to be rotatable and the second assembly are combined together to form a plurality of chambers.

According to some example embodiments, a plasma deposition apparatus includes a chamber, a substrate stage configured to support a substrate in the chamber, a plasma generator configured to generate plasma below an insulation plate and above the substrate stage in an upper portion of the chamber, a gas distribution assembly configured to supply a process gas to a region in which the plasma is generated, a lift mechanism configured to elevate the substrate stage so that a gap between the substrate stage and the insulation plate varies, and a controller connected to the plasma generator, the gas distribution assembly and the lift mechanism, the controller configured to control operations of the plasma generator, the gas distribution assembly and the lift mechanism. A first plasma may be generated between the substrate stage and the insulation plate having a first gap to perform a pre-treatment process on the substrate and a second plasma may be generated between the substrate stage and the insulation plate having a second gap to perform a deposition process on the substrate, the second gap being greater than the first gap.

According to some example embodiments, a plasma deposition apparatus includes a susceptor assembly installed to be rotatable and including a plurality of substrate stages, each of the plurality of substrate stages including a susceptor, and an injector assembly including a plurality of gas injection holes, the injector assembly including a plurality of plasma generators corresponding to the substrate stages, the injector assembly is configured to be combined with the susceptor assembly to form a plurality of chambers, each of the chambers including a substrate stage and a plasma generator corresponding to each other. The susceptor assembly and the injector assembly are configured so that a distance between the substrate stage and an insulation plate of a first chamber of the chambers has a first length, and a distance between the substrate stage and an insulation plate of a second chamber of the chambers has a second length, the second length being greater than the first length.

According to some example embodiments, a plasma deposition apparatus may be configured to adjust a distance between a substrate stage and an insulation plate and generate plasma in different gaps between the substrate stage and the insulation plate to perform a pre-treatment process and a deposition process in-situ.

Accordingly, a distance between the plasma region and a substrate may be adjusted, to provide process conditions satisfying the pre-treatment process and the deposition process. The distance between the substrate stage and the insulation plate may be adjusted to control a plasma density, plasma uniformity, gas uniformity, a gas purge time, etc.

BRIEF DESCRIPTION OF THE DRAWINGS

Example embodiments will be more clearly understood from the following detailed description taken in conjunction with the accompanying drawings. FIGS. 1 to 12 represent non-limiting, example embodiments as described herein.

DETAILED DESCRIPTION

Hereinafter, example embodiments will be explained in detail with reference to the accompanying drawings.

Figure 1:
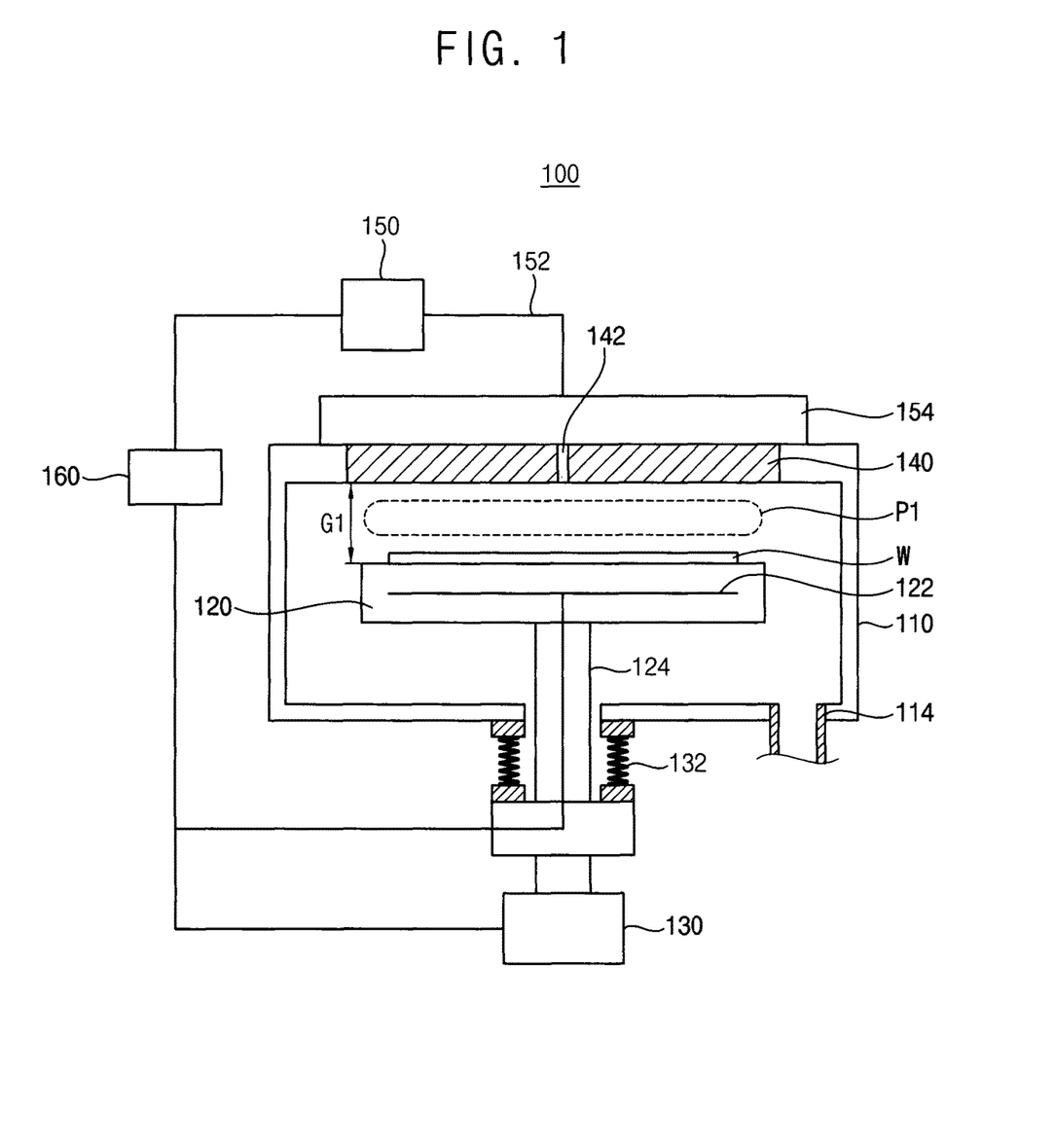
FIG. 1 is a block diagram illustrating a plasma deposition apparatus in accordance with some example embodiments.
Figure 2:
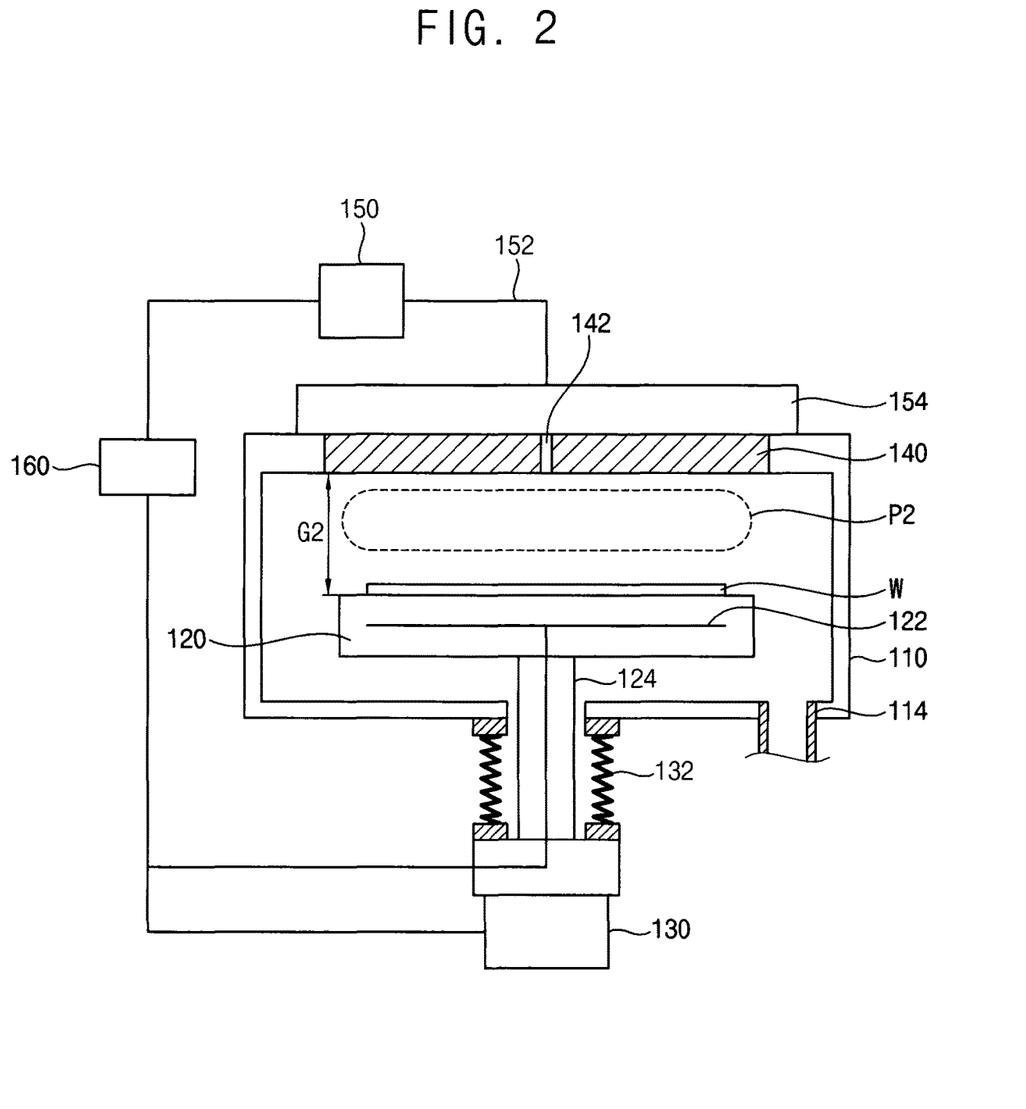
FIG. 2 is a block diagram illustrating the plasma deposition apparatus in FIG. 1, where a substrate heater is lowered.
Figure 3:
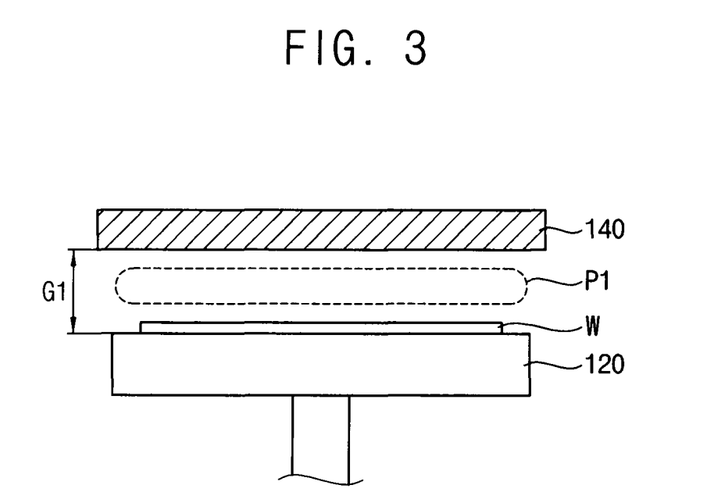
FIG. 3 is a cross-sectional view illustrating a first plasma state between the substrate heater and an insulation plate in FIG. 1.
Figure 4:
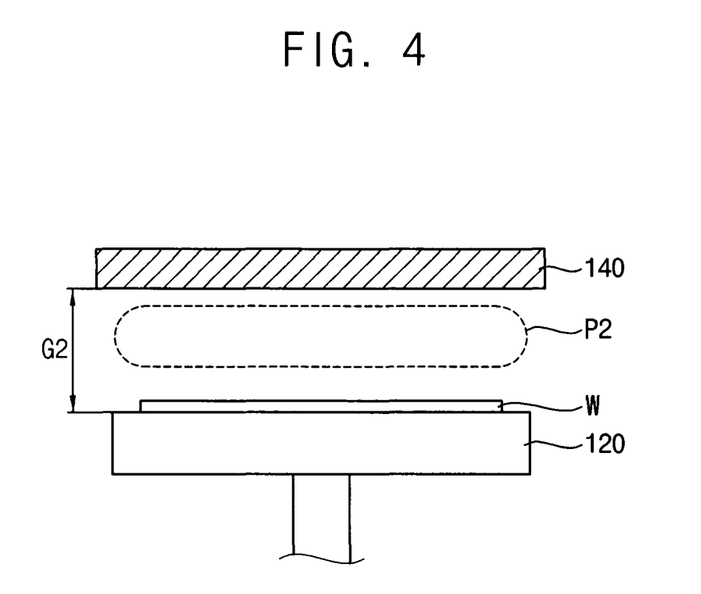
FIG. 4 is a cross-sectional view illustrating a second plasma state between the substrate heater and the insulation plate in FIG. 1.
Figure 5:
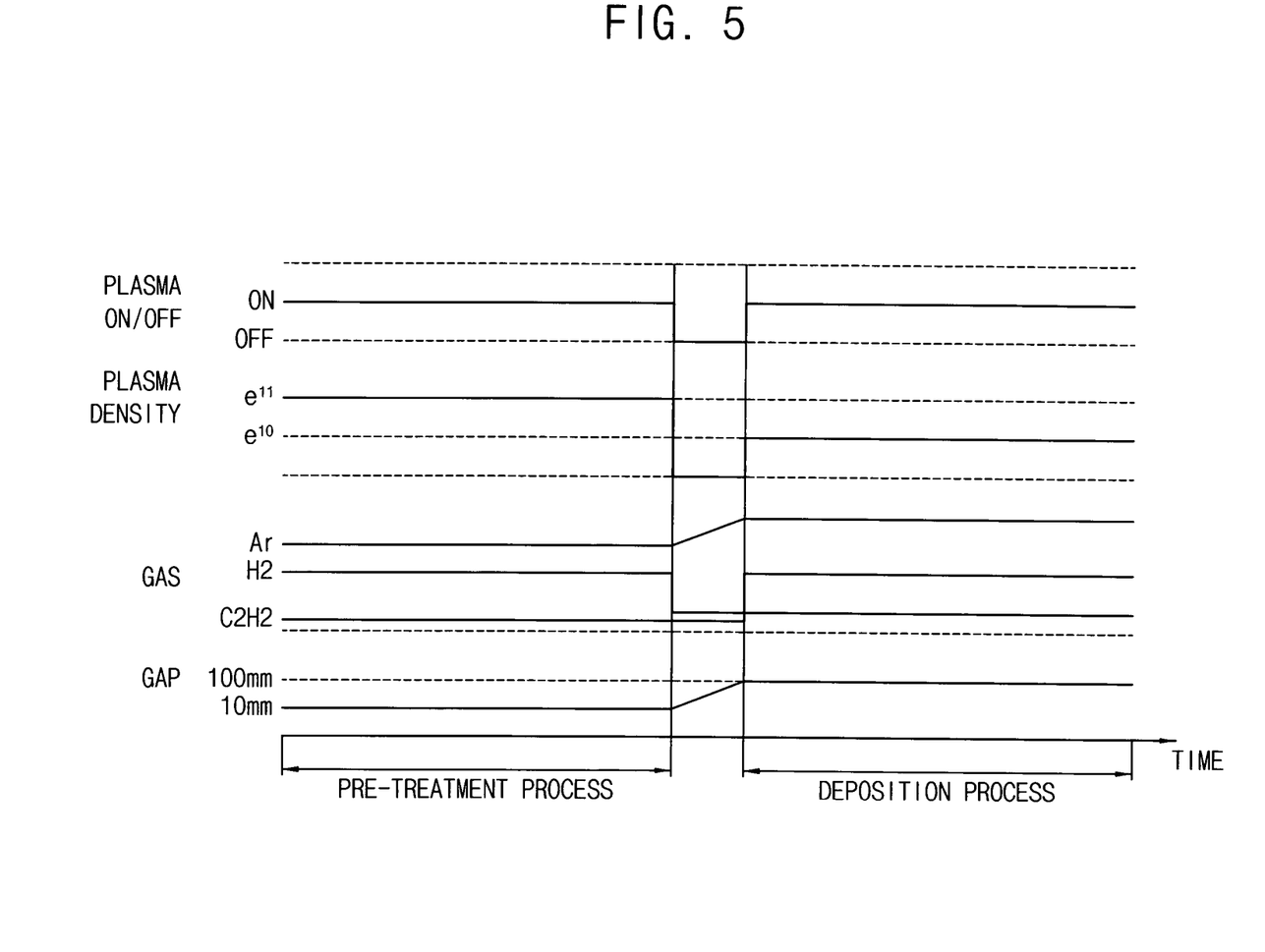
FIG. 5 is a timing diagram illustrating a pre-treatment process and a deposition process performed in-situ by the plasma deposition apparatus in FIG. 1.

FIG. 1 is a block diagram illustrating a plasma deposition apparatus in accordance with some example embodiments. FIG. 2 is a block diagram illustrating the plasma deposition apparatus in FIG. 1, where a substrate heater is lowered. FIG. 3 is a cross-sectional view illustrating a first plasma state between the substrate heater and an insulation plate in FIG. 1. FIG. 4 is a cross-sectional view illustrating a second plasma state between the substrate heater and the insulation plate in FIG. 1. FIG. 5 is a timing diagram illustrating a pre-treatment process and a deposition process performed in-situ by the plasma deposition apparatus in FIG. 1. FIG. 1 represents a state where the substrate heater is raised to maintain a first gap between the substrate heater and the insulation plate, and FIG. 2 represents a state where the substrate heater is lowered to maintain a second gap between the substrate heater and the insulation plate.

Referring to FIGS. 1 to 5, a plasma deposition apparatus 100 may include a chamber 110, a substrate heater assembly, a gas distribution assembly, and a plasma generator configured to generate plasma within the chamber 110 through an insulation plate 140 in an upper portion of the chamber 110. The plasma deposition apparatus 100 may further include an exhaust unit, etc.

In some example embodiments, the plasma deposition apparatus 100 may be an apparatus configured to generate microwave plasma to deposit a layer on a substrate such as a semiconductor wafer W. The microwave plasma may be a plasma generated by applying microwave to a gas. However, the plasma generated by the plasma deposition apparatus may not be limited to the microwave plasma, and, for example, the plasma may be capacitively coupled plasma, inductively coupled plasma, etc. Here, the substrate may include a semiconductor substrate, a glass substrate, etc.

The chamber 110 may include a processing container having a cylindrical shape. The chamber 110 may include aluminum, stainless steel, etc., e.g., in a side wall and/or in the housing of the chamber 110. A gate (not illustrated) for a loading/unloading of the wafer W may be provided in a sidewall of the chamber 110. The wafer W may be loaded/unloaded onto/from a substrate heater serving as a substrate stage through the gate. For example, the substrate stage may be a stage or a support on which the wafer W is disposed/loaded.

The exhaust unit may be connected to an exhaust port 114 which is installed in a bottom portion of the chamber 110, through an exhaust line. The exhaust unit may include a vacuum pump such as a turbo-molecular pump or the like, to control a pressure of the chamber 110 so that a processing space inside the chamber 110 may be depressurized to a desired/predetermined vacuum level. Additionally, process by-products and residual process gases may be discharged from the chamber 110 through the exhaust port 114.

The substrate heater assembly may include the substrate heater 120 as the substrate stage arranged within the chamber 110 to support the substrate. The substrate heater 120 may include a heater 122 configured to heat the substrate to a desired temperature. For example, the heater 122 may include a resistive coil. The substrate heater 120 may include an insulation material such as alumina, aluminum nitride, etc. The heater 122 may be heated to a temperature range of about 100° C. to about 700° C. The coil may be arranged concentrically.

The substrate heater 120 may further include an electrostatic electrode (not illustrated) configured to hold the wafer W thereon using electrostatic force. Further, a lower electrode (not illustrated) to which a radio frequency is applied may be installed in the substrate heater 120.

In some example embodiments, the substrate heater assembly may include a lift mechanism configured to elevate the substrate heater 120. The lift mechanism may include a driving motor 130 to elevate a support shaft 124 connected to the substrate heater 120. The driving motor 130 may elevate the support shaft 124 through a gear drive.

The lift mechanism may include a bellows 132 attached between an end portion of the support shaft 124 and the bottom of the chamber 110 (e.g., a bottom of the chamber housing). The bellows 132 may allow a free vertical movement of the support shaft 124 and may airtightly seal the chamber 110 from the outside.

The plasma generator may include a radial line slot antenna. The plasma generator may use microwaves radiated from the slot antenna to generate/excite plasma. However, it may not be limited thereto, and it may be understood that various plasma sources (e.g., energy sources generating plasma) may be used to generate plasma as described above.

In some example embodiments, the plasma generator may introduce microwaves through the insulation plate 140 serving as a dielectric window in the upper portion of the chamber 110. A high density plasma may be generated/excited in a region directly below the insulation plate 140. The generated plasma may be referred to as a surface wave plasma. For example, the plasma may be generated by electromagnetic surface waves, e.g., by surface waves of microwaves.

The insulation plate 140 may be arranged to cover an opening portion in the upper portion of the chamber 110. For example, the insulation plate 140 may include quartz, alumina, aluminum nitride, etc. A lower surface of the insulation plate 140 may be a front surface facing the substrate heater 120.

The plasma generator may include a microwave power supply 150, a waveguide 152 and a slot antenna 154. A microwave power may be supplied into the chamber 110 through the insulation plate 140 via the slot antenna 154 having a plurality of slots.

The slot antenna 154 may be a metal plate including, for example, copper (Cu). The waveguide 152 may be connected to the microwave power supply for generating an electromagnetic wave having a microwave frequency of, for example, about 2.45 GHz. The waveguide 152 may be connected to the slot antenna 154 to supply the microwave power to the slot antenna 154.

The microwave power may be, for example, about 0.5 W/cm$^2$ to about 4 W/cm$^2$. The microwave may have a microwave frequency of about 300 MHz to about 10 GHz, for example, about 2.45 GHz. The plasma may have the density of about $1\times10^{10}$/cm$^3$ to about $1\times10^{13}$/cm$^3$.

In some example embodiments, the gas distribution assembly may include the insulation plate 140 serving as the dielectric window. The gas distribution assembly may supply a process gas through a gas injection hole 142 formed in the insulation plate 140. Gas injection holes 142 may be formed in a plurality of regions of the insulation plate 140 including a middle region of the insulation plate 140. The process gas may be supplied to a plasma region having a relatively high electron temperature through the gas injection hole 142 formed in the middle region of the insulation plate 140. For example, the plasma region may refer to a region where plasma is formed.

The gas distribution assembly may further include gas injection nozzles installed in an upper sidewall of the chamber 110 to supply the process gas to the plasma region. In this case, the gas injection nozzles may be arranged along the upper sidewall of chamber 110 to be spaced apart from each other in a circumferential direction.

The gas distribution assembly may supply a first process gas for a pre-treatment process. For example, the first process gas may include hydrogen (H$_2$). The gas distribution assembly may supply a second process gas for a deposition process. For example, the second process gas may include a gas containing carbon. The gas containing carbon may include acetylene (C$_2$H$_2$), methane (CH$_4$), etc. Additionally, the gas distribution assembly may supply a plasma gas such as argon (Ar), helium (He), etc. For example, a plasma gas, e.g., argon/helium gas, may be provided into the chamber 110, the plasma generator may irradiate the plasma gas with microwaves to generate plasma, and the first process gas or the second process may be provided to a region where the plasma is generated to perform the pre-treatment process or the deposition process. For example, the plasma gas and the first or second process gas may be continuously supplied into the chamber 110 while the corresponding first or second process is performed. In certain embodiments, the plasma gas and the first or second process gas may be supplied together from the beginning.

A controller 160 may monitor outputs from the plasma deposition apparatus 100 and control operations thereof. The controller may include a microcomputer and various interface circuits. The controller may be connected to the heater 122, the driving motor 130, the exhaust unit, the microwave power supply 150, etc. and may communicate information therebetween. Programs stored in a memory of the controller may be used to control components of the plasma deposition apparatus 100 based on stored information, e.g., process recipe information.

As illustrated in FIGS. 1 and 3, a distance between the substrate heater 120 and the insulation plate 140 may be maintained at a first gap G1, and a first plasma P1 may be generated between the substrate heater 120 and the insulation plate 140.

The lift mechanism may raise the support shaft 124 to maintain the first gap G1 between the substrate heater 120 and the insulation plate 140. The first plasma P1 may be generated directly below the lower surface of the insulation plate 140 by the microwave emitted from the slot antenna 154, and the gas distribution assembly may supply a process gas to a first plasma region. The first plasma P1 may have a first plasma density.

As illustrated in FIGS. 2 and 4, a distance between the substrate heater 120 and the insulation plate 140 may be maintained at a second gap G2 greater than the first gap G1, and a second plasma P2 may be generated between the substrate heater 120 and the insulation plate 140.

The lift mechanism may lower the support shaft 124 to maintain the second gap G2 between the substrate heater 120 and the insulation plate 140. The second plasma P2 may be generated directly below the lower surface of the insulation plate 140 by the microwave emitted from the slot antenna 154, and the gas distribution assembly may supply a process gas to a second plasma region. The second plasma P2 may have a second plasma density greater than the first plasma density. For example, the second plasma P2 may be generated in a region covering a different region from the region where the first plasma P1 is generated, and the second plasma P2 may be generated in a different time than a time when the first plasma P1 is generated in the chamber 110.

The plasma in the plasma excitation region may have a high density and a relatively high electron temperature, but since the plasma is diffused to the substrate processing region, the electron temperature may be lowered. Further, the electron density may be also lowered by such diffusion. For example, the plasma excitation region may be an upper portion of the chamber between the insulation plate 140 and the substrate heater 120, and the substrate processing region may be a lower portion of the chamber between the insulate plate 140 and the substrate heater 120. An amount of radicals (e.g., hydrogen radicals), which are excited in the high density plasma excitation region, to be transferred to the substrate processing region may depend on the distance between the substrate heater 120 and the insulation plate 140. For example, more radicals may be transferred when the distance between the substrate heater 120 and the insulation plate 140 is closer rather than farther, and less radicals may be transferred when the distance between the substrate heater 120 and the insulation plate 140 is farther rather than closer.

As illustrated in FIG. 5, in some example embodiments, a pre-treatment process and a deposition process may be performed in-situ in the plasma deposition apparatus 100 to form a graphene layer on the wafer W.

In the pre-treatment process, a first plasma P1 may be generated between the substrate heater 120 and the insulation plate 140 having a first gap G1 and a hydrogen gas (H$_2$) may be supplied to remove an oxide layer or a foreign substance on the wafer W. The oxide layer may be formed by an oxidization of a surface of the wafer by combining of atoms of the wafer with oxygen molecules in the air. The first gap G1 may be 10 mm, and the first plasma P1 may have a density of $1\times10^{11}/cm^3$.

In the deposition process, a second plasma P2 may be generated between the substrate heater 120 and the insulation plate 140 having a second gap G2 and an acetylene gas ($C_2H_2$) may be supplied to form a graphene layer on the wafer W. The second gap G2 may be 100 mm, and the second plasma P2 may have a density of $1\times10^{10}/cm^3$, for example. In certain embodiments, 4 to 10 graphene layers may be stacked on the wafer W.

The graphene deposition process may use a uniform (gas state) reaction, the precursor such as the acetylene ($C_2H_2$) may be reacted in an area proximate to the slot antenna 154, e.g., directly below the lower surface of the insulation plate 140. For example, the graphene deposition process may use a precursor gas including carbon. However, since the wafer should be protected from damage from the plasma, the distance between the substrate heater 120 and the insulation plate 140 may be maintained at a relatively large gap. The acetylene precursor may be decomposed by the plasma as expressed in a following chemical reaction equation (1).

$$C_2H_2 \rightarrow C^* + H2^* \quad (1)$$

The pre-treatment process may be performed for forming a high-quality graphene layer. The pre-treatment process may use hydrogen gas, the plasma generator may generate hydrogen radicals with the hydrogen gas, and the hydrogen radicals generated by plasma may have a very short life time. Accordingly, the distance between the substrate heater 120 and the insulation plate 140 may be maintained at a relatively small gap. The hydrogen gas may be decomposed by the plasma as expressed in a following chemical reaction equation (2).

$$H_2 \rightarrow H^* \quad (2)$$

As mentioned above, the plasma deposition apparatus 10 may adjust the distance between the substrate heater 120 and the insulation plate 140 to generate plasma at different gaps therebetween and may perform the pre-treatment process and the deposition process in-situ.

Figure 6:
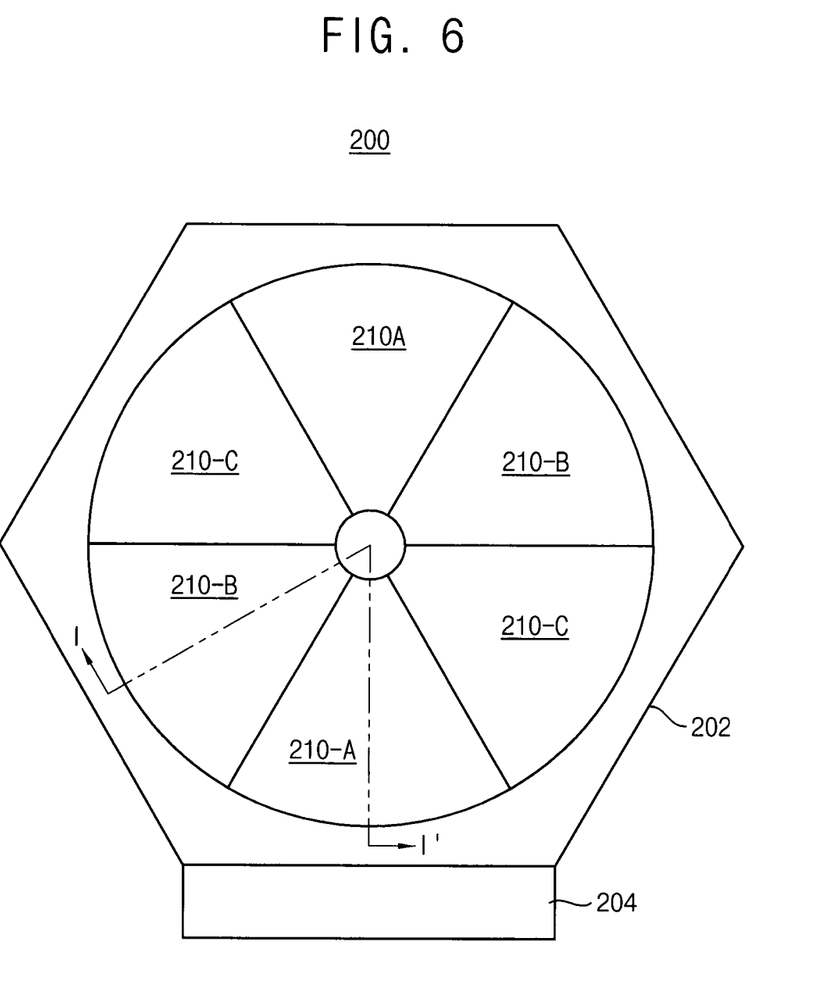
FIG. 6 is a plan view illustrating a plasma deposition apparatus in accordance with some example embodiments.
Figure 7:
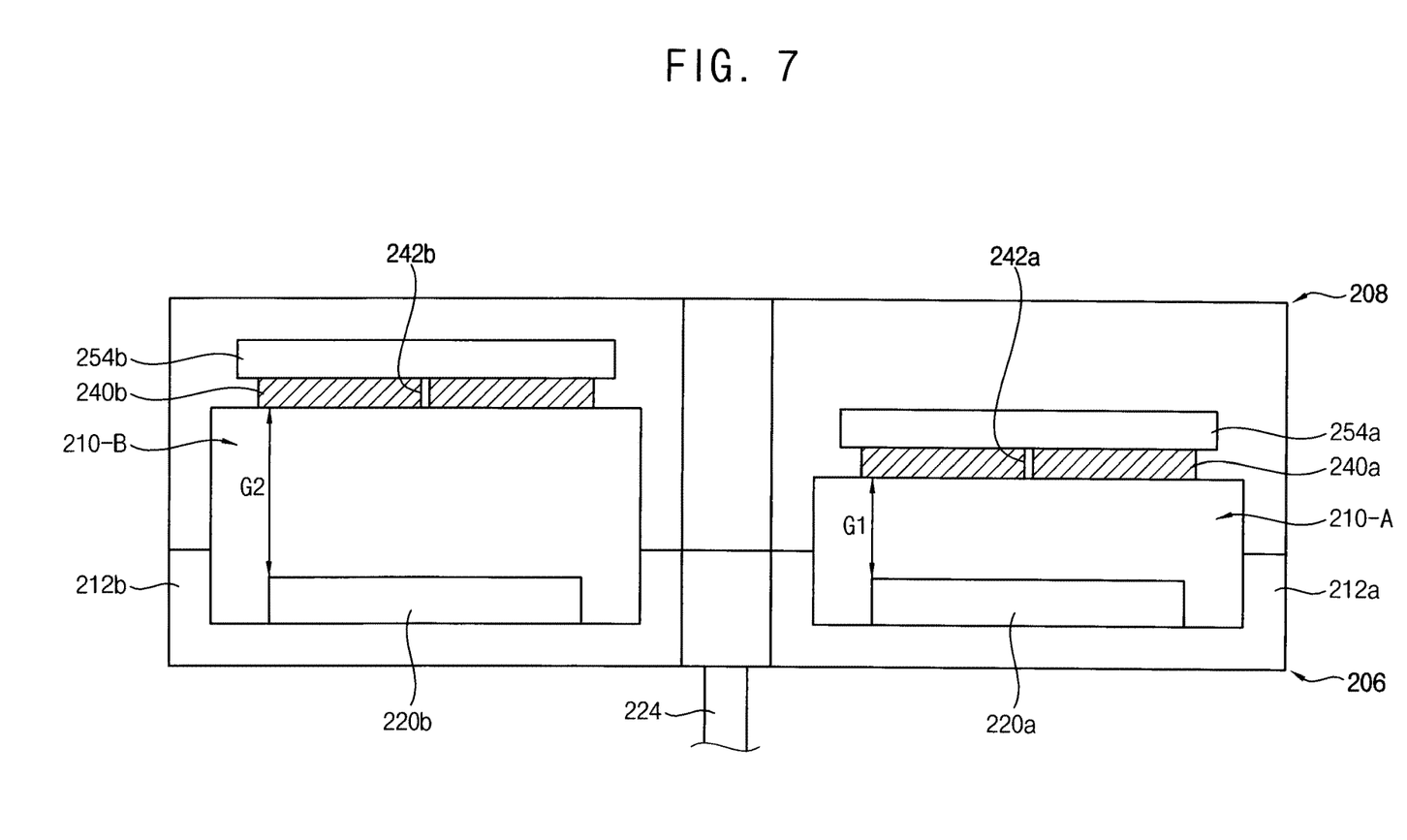
FIG. 7 is a cross-sectional view taken along the line I-I' in FIG. 6.

FIG. 6 is a plan view illustrating a plasma deposition apparatus in accordance with some example embodiments. FIG. 7 is a cross-sectional view taken along the line I-I' in FIG. 6. The plasma deposition apparatus may be substantially the same as or similar to the plasma deposition apparatus described with reference to FIGS. 1 to 5 except for a configuration of a carousel-type chamber. For example, the plasma deposition apparatus illustrated in FIGS. 6 and 7 may include chambers and/or stages configured to rotate to sequentially process a plurality of wafers W. Thus, same reference numerals will be used to refer to the same or like elements and any further repetitive explanation concerning the above elements will be omitted.

Referring to FIGS. 6 and 7, the plasma deposition apparatus 200 may include a plurality of chambers 210-A, 210-B and 210-C which sequentially perform different processes. The plasma deposition apparatus 200 may include sidewall partitions to divide a processing space into the plurality of chambers. At least one of the chambers may generate microwave plasma to process a wafer W.

For example, the plasma deposition apparatus 200 may include an injector assembly 208 and a susceptor assembly 206 clamped/combined together to define a plurality of the chambers 210-A, 210-B and 210-C. For example, the injector assembly 208 may include a plurality gas injection holes, and the susceptor assembly 206 may include a plurality of heaters converting electromagnetic energy into heat. The injector assembly 208 may include a rigid stationary body. The susceptor assembly 206 may be positioned under the injector assembly 208 and may be a carousel-type assembly including a plurality of divisions divided by respective partitions. For example, the susceptor assembly 206 may be configured to rotate 224 with respect to a central axis in a plan view. The susceptor assembly 206 may be configured to form a plurality of chambers by combining with the injector assembly 208 for holding a plurality of wafers respectively. The injector assembly 208 and the susceptor assembly 206 may have surfaces engaged with each other.

The susceptor assembly 206 may include a support post 224 which is capable of lifting, lowering and rotating the susceptor assembly 206. The susceptor assembly 206 may include lines for a heater within the support post 224. The support post 224 may decrease a gap between the susceptor assembly 206 and the injector assembly 208 to clamp/combine the susceptor assembly 206 and the injector assembly 208 together.

The susceptor assembly 206 may include sidewalls 212a and 212b respectively defining recesses which form lower portions of respective chambers 210-A, 210-B and 210-C. The susceptor assembly 206 may include substrate heaters 220a and 220b serving as substrate stages disposed within the recesses respectively.

The injector assembly 208 may include sidewalls each defining a recess which forms an upper portion of a chamber of the plurality of chambers 210-A, 210-B and 210-C. The injector assembly 208 may include plasma generators configured to introduce microwave into respective chambers through insulation plates 240a and 240b corresponding to the respective substrate heaters. A microwave power may be supplied into each chamber through a corresponding one of the insulation plates 240a and 240b via a corresponding one of slot antennas 254a and 254b each having a plurality of slots.

The injector assembly 208 may include a gas distribution assembly configured to supply a process gas through a corresponding one of gas injection holes 242a and 242b formed in the insulation plates 240a and 240b respectively. The gas distribution assembly may further include gas injection nozzles installed in an upper sidewall of each chamber to supply the process gas to a plasma region.

The injector assembly 208 and the susceptor assembly 206 may be clamped/combined together to form a plurality of the chambers 210-A, 210-B and 210-C (for example, six chambers).

In some example embodiments, a first chamber 210-A may provide a process condition for performing a pre-treatment process. A second chamber 210-B may provide a process condition for performing a deposition process. A third chamber 210-C may provide a process condition for performing an after-treatment process.

As illustrated in FIG. 7, the substrate heater 220a and the insulation plate 240a of the first chamber 210-A may be arranged to have a first gap G1, and the substrate heater 220b and the insulation plate 240b of the second chamber 210-B may be arranged to have a second gap G2 greater than the first gap G1.

In the first chamber 210-A, a first plasma P1 may be generated between the substrate heater 220a and the insulation plate 240a having the first gap G1 and a hydrogen gas ($H_2$) may be supplied to remove an oxide layer or foreign substances on the wafer W. The oxide layer may be formed by an oxidization of a surface of the wafer by combining of atoms of the wafer with oxygen molecules in the air.

In the second chamber 210-B, a second plasma P2 may be generated between the substrate heater 220b and the insulation plate 240b having the second gap G2 and an acetylene gas ($C_2H_2$) may be supplied to form a graphene layer on the wafer W.

Although it is not illustrated in the figures, in the third chamber 210-C, a third plasma may be generated between the substrate heater and the insulation plate having a third gap and a purge gas or an annealing gas may be supplied to perform an annealing process on the wafer W. In this case, a lamp may be used instead of the third plasma. The lamp may include a mercury lamp, an arc lamp, a halogen lamp, etc.

After a wafer is loaded into the first chamber 210-A through a gate valve 204, as the susceptor assembly 206 rotates by a predetermined angle (for example, 60 degrees), different processes may be performed sequentially in each of the chambers.

Hereinafter, a method of processing a wafer using the plasma deposition apparatus in FIGS. 6 and 7 will be explained.

FIGS. 8 to 11 are cross-sectional views illustrating a method of processing a wafer using the plasma deposition apparatus in FIG. 7. FIGS. 8 to 11 are cross-sectional views taken along the line I-I' in FIG. 6.

Figure 8:
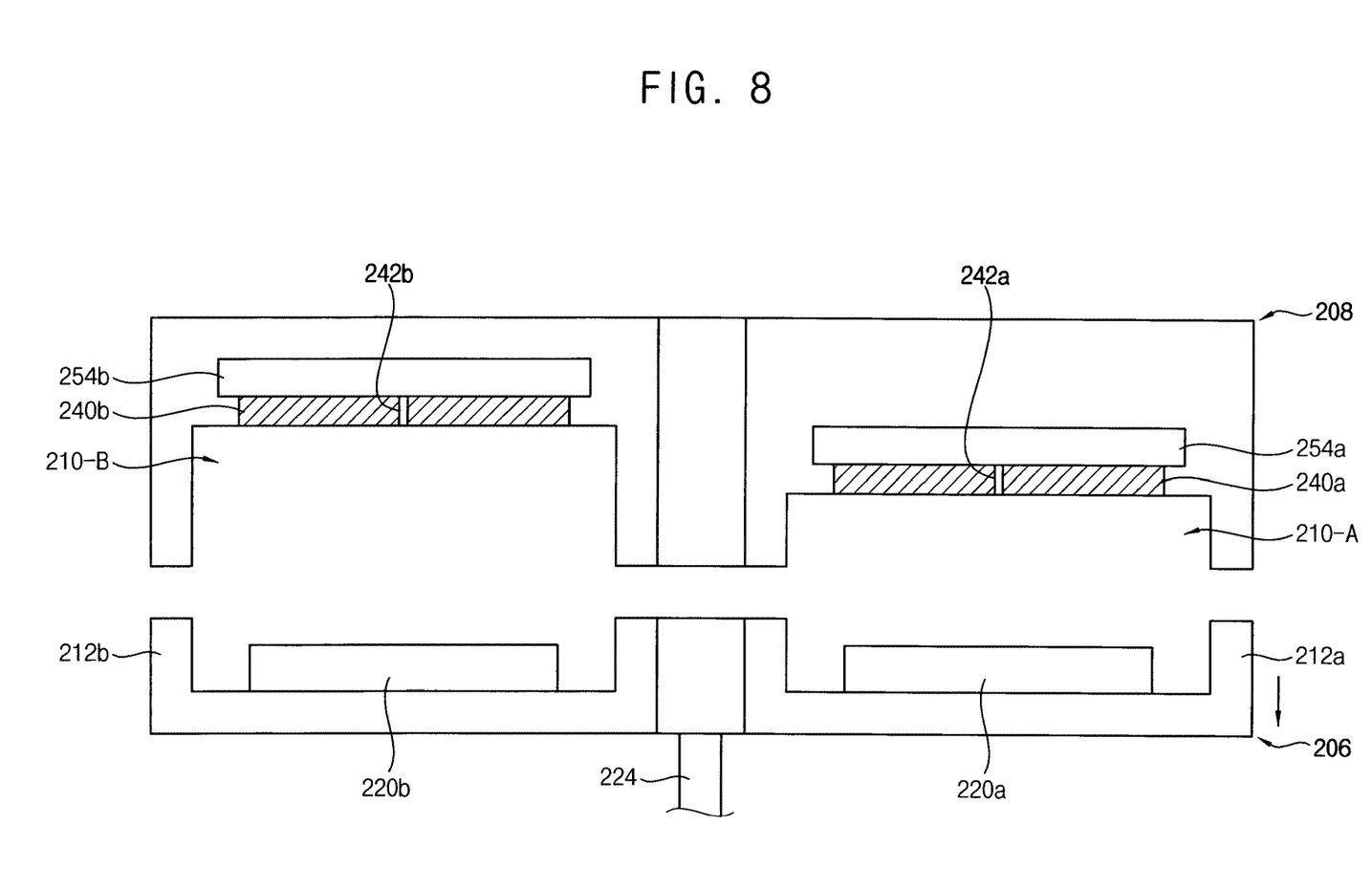
FIGS. 8 to 11 are cross-sectional views illustrating a method of processing a wafer using the plasma deposition apparatus in FIG. 7.

Referring to FIG. 8, after a susceptor assembly 206 is lowered, a first wafer W1 may be loaded onto a substrate heater 220a through a gate valve 240.

Figure 9:
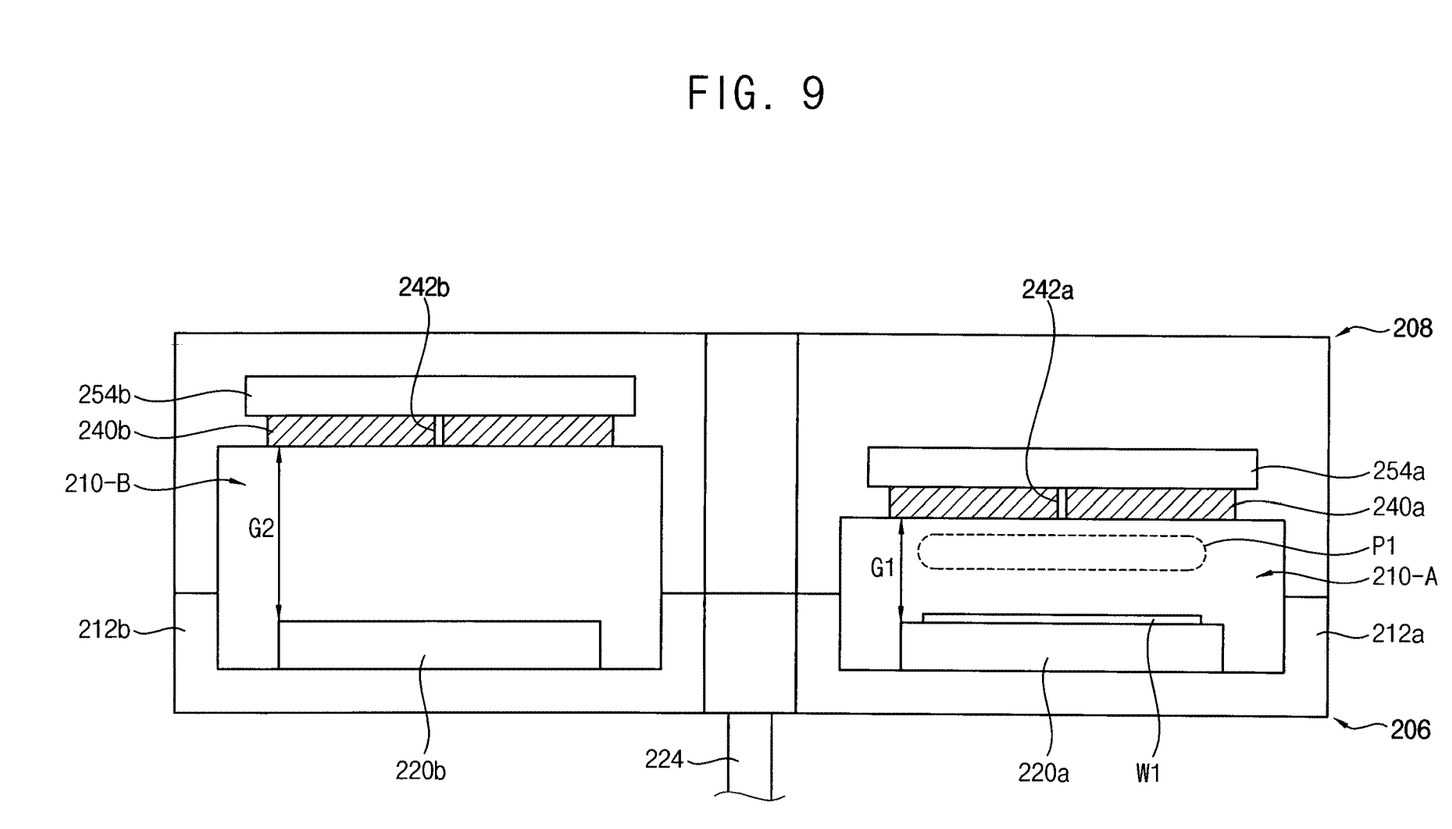

Referring to FIG. 9, the susceptor assembly 206 may be raised to clamp/combine with an injector assembly 208 to form a first chamber 210-A.

A distance between the substrate heater 220a and an insulation plate 240a of the first chamber 210-A may have a first gap G1. A first plasma P1 may be generated between the substrate heater 220a and the insulation plate 240a having the first gap G1 and a hydrogen gas ($H_2$) may be supplied to remove an oxide layer or foreign substances on the first wafer W1. The oxide layer may be formed by an oxidization of a surface of the wafer by combining of atoms of the wafer with oxygen molecules in the air.

Figure 10:
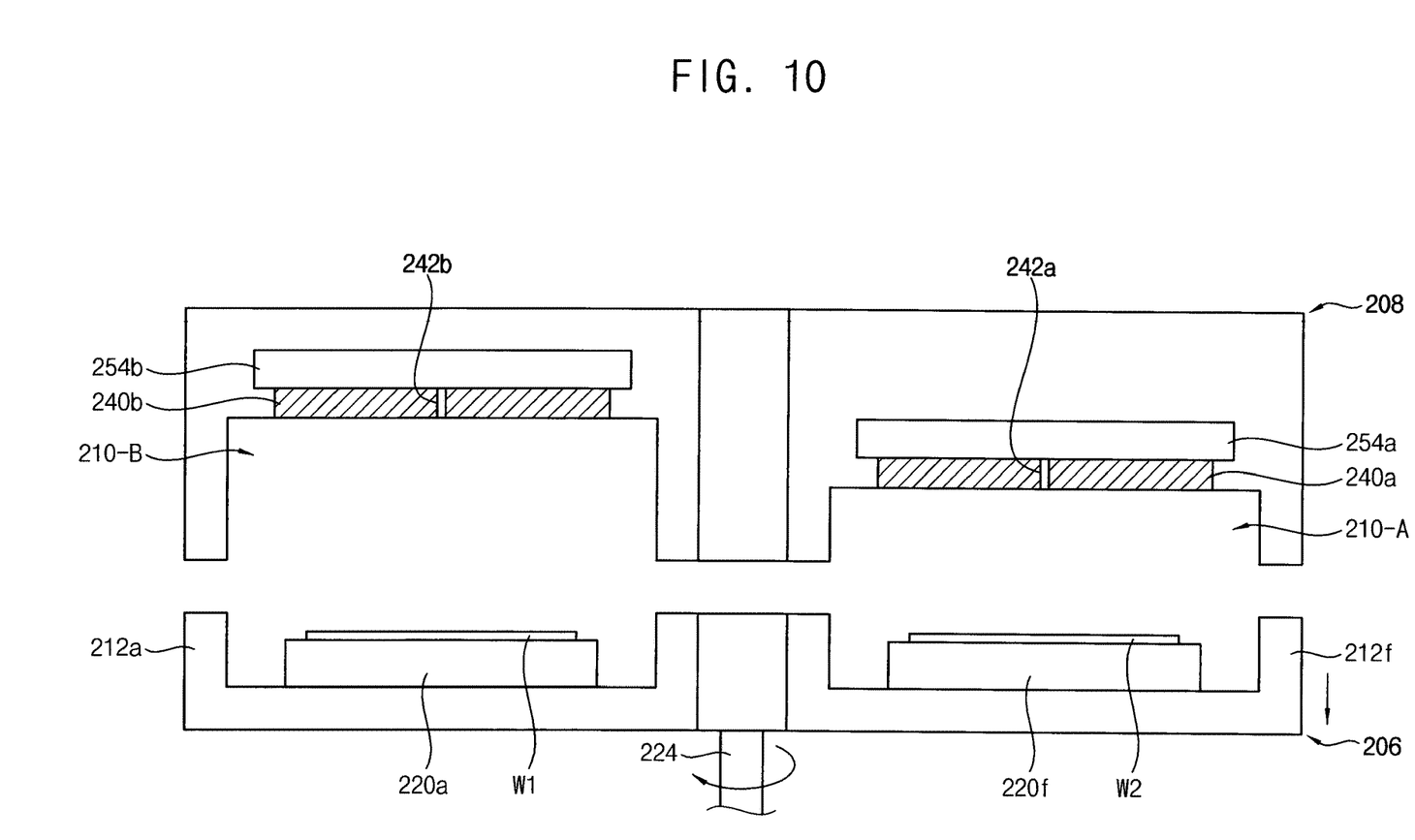

Referring to FIG. 10, after the susceptor assembly 206 is lowered and rotates by a predetermined angle (for example, 60 degrees), a second wafer W2 may be loaded onto a substrate heater 220f through the gate valve 240.

As the susceptor assembly 206 rotates, the substrate heater 220a on which the first wafer W1 is held may move to face an insulation plate 240b and the substrate heater 220f on which the second wafer W2 is held may face the insulation plate 240a.

Figure 11:
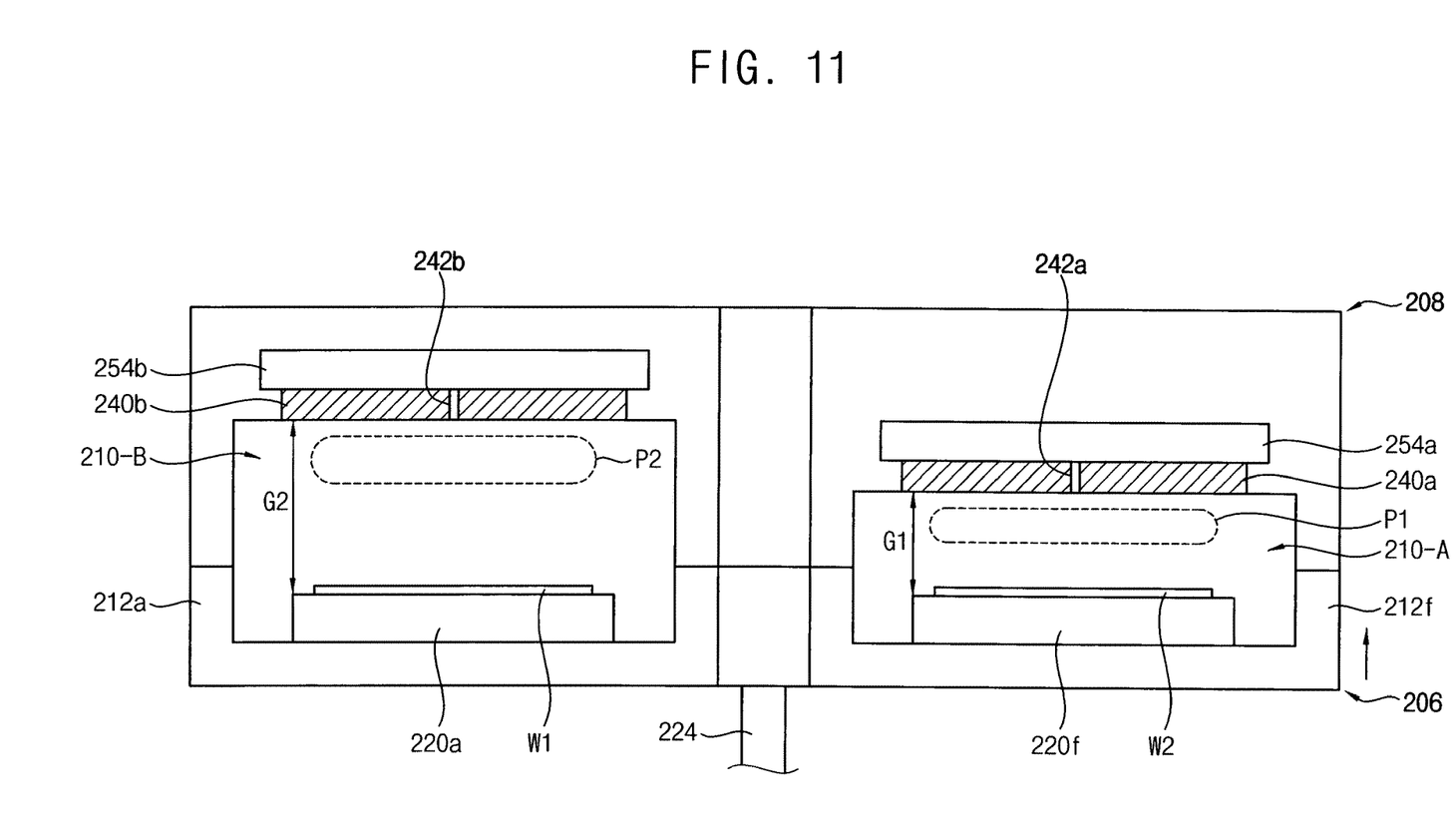

Referring to FIG. 11, the susceptor assembly 206 may be raised to clamp/combine with the injector assembly 208 to form the first chamber 210-A and a second chamber 210-B.

A distance between the substrate heater 220a and the insulation plate 240b of the second chamber 210-B may have a second gap G2. A second plasma P2 may be generated between the substrate heater 220a and the insulation plate 240b having the second gap G2 and an acetylene gas ($C_2H_2$) may be supplied to form a graphene layer on the first wafer W1.

At the same time, a distance between the substrate heater 220f and the insulation plate 240a of the first chamber 210-A may have the first gap G1. The first plasma P1 may be generated between the substrate heater 220f and the insulation plate 240a having the first gap G1 and a hydrogen gas ($H_2$) may be supplied to remove an oxide layer or foreign substances on the second wafer W2. The oxide layer may be formed by an oxidization of a surface of the wafer by combining of atoms of the wafer with oxygen molecules in the air.

Although it is not illustrated in the figures, after the susceptor assembly 206 is lowered and rotates by a predetermined angle (for example, 60 degrees), a third wafer may be loaded onto a substrate heater through the gate valve 240. The susceptor assembly 206 may be raised to clamp/combine with the injector assembly 208 to form the first chamber 210-A and the second chamber 210-B and a third chamber 210-C.

A distance between the substrate heater 220a and an insulation plate of the third chamber 210-C may have a third gap. A third plasma may be generated between the substrate heater 220a and the insulation plate having the third gap G3 and an annealing process may be performed on the first wafer W1.

At the same time, a distance between the substrate heater 220f and the insulation plate 240b of the second chamber 210-B may have the second gap G2. The second plasma P2 may be generated between the substrate heater 220f and the insulation plate 240b having the second gap G2 and an acetylene gas ($C_2H_2$) may be supplied to form a graphene layer on the second wafer W2.

At the same time, a distance between a substrate heater and the insulation plate 240a of the first chamber 210-A may have the first gap G1. The first plasma P1 may be generated between the substrate heater and the insulation plate 240a having the first gap G1 and a hydrogen gas ($H_2$) may be supplied to remove an oxide layer or foreign substances on the third wafer. The oxide layer may be formed by an oxidization of a surface of the wafer by combining of atoms of the wafer with oxygen molecules in the air.

As mentioned above, as the carousel-type susceptor assembly 206 rotates by a predetermined angle, the susceptor assembly 206 and the injector assembly 208 may clamp together to form a plurality of the chambers 210-A, 210-B and 210-C. As the susceptor assembly 206 rotates, the wafer may be moved sequentially to the chambers and different processes may be performed on the wafer in the chambers. In certain embodiments, the plasma deposition apparatus 200 may include a second gate valve. For example, in case that the plasma deposition apparatus 200 includes six chambers as shown in FIG. 6, the plasma deposition apparatus may include a second gate valve on the opposite side of the gate valve 204 of FIG. 6 so that wafers W may be unloaded after annealing process through the second gate valve and new wafers may be loaded through the second gate valve after the annealed wafers are unloaded.

The distance between the substrate heater and the insulation plate may be adjusted to be different in the chambers, to thereby provide proper process conditions satisfying the pre-treatment process and the deposition process in a graphene layer forming process.

Hereinafter, a method of depositing a layer on a substrate using the plasma deposition apparatus in FIGS. 1 and 6 will be explained.

Figure 12:
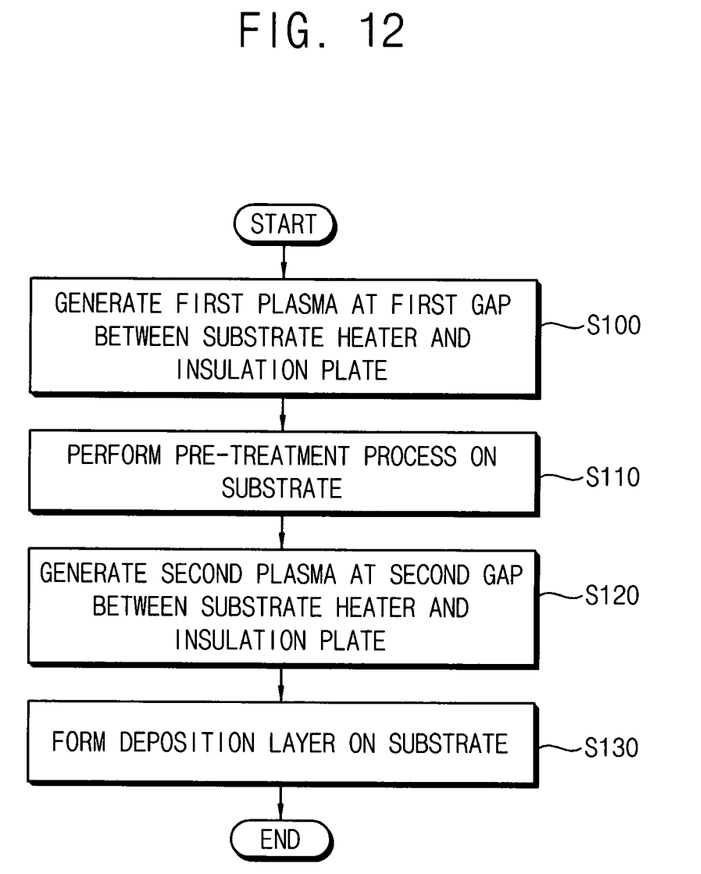
FIG. 12 is a flow chart illustrating a plasma deposition process in accordance with some example embodiments.

FIG. 12 is a flow chart illustrating a plasma deposition process in accordance with some example embodiments. The plasma deposition method may be applied for forming a graphene layer on a wafer using microwave plasma, however, it may not be limited thereto. For example, the plasma deposition method may be applied to form a layer other than a graphene layer.

Referring to FIGS. 1, 2, 6, 7 and 12, first, a substrate such as a wafer W may be loaded onto a substrate heater within a chamber, and then, a first plasma may be generated between the substrate heater and an insulation plate having a first gap (S100). Then, a first process gas may be supplied to the first plasma region to perform a pre-treatment process on the substrate (S110). Then, a second plasma may be generated between the substrate heater and the insulation plate having a second gap (S120), and then, a second process gas may be supplied to the second plasma region to perform a deposition process on the substrate (S130).

As illustrated in FIGS. 1 and 3, a distance between the substrate heater 120 and the insulation plate 140 may be maintained at a first gap G1, and a first plasma P1 may be generated at a position spaced apart from the substrate by a first distance. For example, a center of distribution of the first plasma P1 may have the first distance from the substrate. Microwave may be supplied through the insulation plate 140 in an upper portion of a chamber 110 to form a surface wave plasma on a lower surface of the insulation plate 140.

A gas distribution assembly may supply a first process gas for the pre-treatment process to the first plasma region. For example, the first process gas may include hydrogen ($H_2$). The first gap G1 may be about 10 mm, and the first plasma P1 may have a density of about $1 \times 10^{11}/cm^3$. For example, the first gap G1 may be between 8 mm and 12 mm, and the first plasma P1 may have a density between $8 \times 10^{10}/cm^3$ and $1.2 \times 10^{11}/cm^3$.

After the pre-treatment process is completed, a distance between the substrate heater 120 and the insulation plate 140 may be adjusted. For example, the substrate heater 120 may be lowered by a lift mechanism.

As illustrated in FIGS. 2 and 4, a distance between the substrate heater 120 and the insulation plate 140 may be maintained at a second gap G2 greater than the first gap G1, and a second plasma P2 may be generated at a position spaced apart from the substrate by a second distance greater than the first distance. For example, the center of distribution of the first plasma P1 may be closer to the substrate than a center of distribution of the second plasma P2 is to the substrate. For example, the center of distribution of the second plasma P2 may have the second distance from the substrate. Microwave may be supplied through the insulation plate 140 in an upper portion of the chamber 110 to form a surface wave plasma on the lower surface of the insulation plate 140.

The gas distribution assembly may supply a second process gas for the deposition process to the second plasma region. For example, the second process gas may include acetylene gas ($C_2H_2$). The second gap G2 may be about 100 mm, and the second plasma P2 may have a density of about $1 \times 10^{10}/cm^3$. For example, the second gap G2 may be between 80 mm and 120 mm, and the second plasma P2 may have a density between $8 \times 10^9/cm^3$ and $1.2 \times 10^{10}/cm^3$. Therefore, the first plasma P1 and second plasma P2 may be different in both density and gas composition.

As illustrated in FIGS. 6 and 7, a substrate may be loaded onto a substrate heater 220a of a first chamber 210-A of a plurality of chambers 210-A, 210-B and 210-C. A susceptor assembly 206 installed to be rotatable and including a plurality of substrate heaters and an injector assembly 208 including a plurality of plasma generators may be clamped/combined together to form the chambers.

A first plasma may be generated within the first chamber 210-A having a first gap G1 between the substrate heater 220a and an insulation plate 240a. A gas distribution assembly may supply a first process gas for the pre-treatment process to the first plasma region. For example, the first process gas may include hydrogen ($H_2$).

After the pre-treatment process is completed in the first chamber 210-A, the susceptor assembly 206 rotates by a predetermined angle, and a second chamber 210-B having a second gap G2 between the substrate heater 220a and an insulation plate 240b may be formed.

A second plasma may be generated within the second chamber 210-B having the second gap G2 greater than the first gap G1 between the substrate heater 220a and the insulation plate 240b. The gas distribution assembly may supply a second process gas for the deposition process to the second plasma region. For example, the second process gas may include acetylene gas ($C_2H_2$).

The graphene layer formed by the plasma deposition apparatus and method may have excellent mechanical strength, thermal stability, diffusion barrier capability with a thin thickness. The graphene layer may be used for a gate metal layer of a semiconductor device, an interconnector in a wiring process, etc.

The above plasma deposition apparatus and method may be used to manufacture semiconductor devices including logic devices and memory devices. For example, the semiconductor device may be applied to various systems such as a computing system. The semiconductor device may include finFET, DRAM, VNAND, etc. The system may be applied to a computer, a portable computer, a laptop computer, a personal portable terminal, a tablet, a cell phone, a digital music player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A plasma deposition method, comprising:
   loading a substrate onto a substrate stage within a chamber;
   generating a first plasma at a region separated from the substrate by a first distance;
   supplying a first process gas to the first plasma region to perform a pre-treatment process on the substrate;
   generating a second plasma at a region separated from the substrate by a second distance different from the first distance; and
   supplying a second process gas to the second plasma region to perform a deposition process on the substrate,
   wherein generating the first plasma and the second plasma comprises supplying microwave through an insulation plate disposed in an upper portion of the chamber,
   wherein generating the first plasma comprises maintaining a first gap between the substrate stage and the insulation plate, and
   wherein generating the second plasma comprises maintaining a second gap between the substrate stage and the insulation plate, the second gap being greater than the first gap.

2. The plasma deposition method of claim 1, further comprising adjusting a distance between the substrate stage and the insulation plate, after generating the first plasma.

3. The plasma deposition method of claim 2, wherein adjusting the distance between the substrate stage and the insulation plate comprises lowering the substrate stage.

4. The plasma deposition method of claim 1, wherein generating the first plasma and the second plasma are performed within the same chamber and in different times, and
wherein a center of distribution of the first plasma is at the first distance from the substrate and a center of distribution of the second plasma is at the second distance from the substrate.

5. The plasma deposition method of claim 1, wherein the first process gas includes a hydrogen gas and the second process gas includes a precursor gas containing carbon.

6. A plasma deposition method, comprising:
loading a substrate onto a substrate stage within a chamber;
maintaining a first gap between the substrate stage and an insulation plate;
generating a first plasma between the substrate stage and the insulation plate;
supplying a first process gas to a first region in which the first plasma is generated to perform a pre-treatment process on the substrate;
maintaining a second gap between the substrate stage and the insulation plate, the second gap being greater than the first gap;
generating a second plasma between the substrate stage and the insulation plate; and
supplying a second process gas to a second region in which the second plasma is generated to perform a deposition process on the substrate.

7. The plasma deposition method of claim 6, wherein generating the first plasma and the second plasma comprises supplying a microwave through the insulation plate in an upper portion of the chamber.

8. The plasma deposition method of claim 7, further comprising adjusting a distance between the substrate stage and the insulation plate after generating the first plasma.

9. The plasma deposition method of claim 8, wherein adjusting the distance between the substrate stage and the insulation plate comprises lowering the substrate stage.

10. The plasma deposition method of claim 6, wherein generating the first plasma and generating the second plasma are performed within the chamber.

11. A plasma deposition method, comprising:
loading a substrate onto a first substrate stage of a first assembly comprising a plurality of substrate stages;
maintaining a first gap between the first substrate stage and a first insulation plate of a second assembly comprising a plurality of insulation plates;
generating a first plasma between the first substrate stage and the first insulation plate;
supplying a first process gas to a first region in which the first plasma is generated to perform a pre-treatment process on the substrate;
maintaining a second gap between the first substrate stage and a second insulation plate of the second assembly, the second gap being greater than the first gap;
generating a second plasma between the first substrate stage and the second insulation plate; and
supplying a second process gas to a second region in which the second plasma is generated to perform a deposition process on the substrate,
wherein the first assembly installed to be rotatable and the second assembly are combined together to form a plurality of chambers.

12. The plasma deposition method of claim 11, wherein generating the first plasma comprises generating the first plasma within a first chamber of the plurality of chambers, the first chamber having the first gap between the first substrate stage and the first insulation plate, and
wherein generating the second plasma comprises generating the second plasma within a second chamber of the plurality of chambers, the second chamber having the second gap between the first substrate stage and the second insulation plate.

13. The plasma deposition method of claim 12, wherein generating the second plasma comprises rotating the first assembly by a predetermined angle to form the second chamber having the second gap between the first substrate stage and the second insulation plate.

14. The plasma deposition method of claim 13, wherein the first process gas includes a hydrogen gas and the second process gas includes a precursor gas containing carbon.

15. The plasma deposition method of claim 11, wherein the first plasma has a first plasma density and the second plasma has a second plasma density less than the first plasma density.

\* \* \* \* \*